United States Patent [19]

Boudewijns

[11] Patent Number: 4,757,365
[45] Date of Patent: Jul. 12, 1988

[54] CCD IMAGE SENSOR WITH SUBSTANTIALLY IDENTICAL INTEGRATION REGIONS

[75] Inventor: Arnoldus J. J. Boudewijns, Eindhoven, Netherlands

[73] Assignee: U.S. Philips Corporation, New York, N.Y.

[21] Appl. No.: 48,474

[22] Filed: May 6, 1987

Related U.S. Application Data

[63] Continuation of Ser. No. 573,441, Jan. 24, 1984, abandoned.

[30] Foreign Application Priority Data

Feb. 1, 1983 [NL] Netherlands ............... 8300366

[51] Int. Cl.$^4$ ............. H01L 29/78; H01L 27/14; H01L 31/00; H01L 29/04
[52] U.S. Cl. .................. 357/24; 357/30; 357/59
[58] Field of Search ............... 357/24, 30, 59; 377/57–63

[56] References Cited

U.S. PATENT DOCUMENTS

| | | | |
|---|---|---|---|
| 3,758,794 | 9/1973 | Kosonocky | 307/304 |
| 3,760,202 | 9/1973 | Kosonocky | 307/304 |
| 3,921,195 | 11/1975 | Smith et al. | 357/24 |
| 4,141,024 | 2/1979 | Kano et al. | |
| 4,194,213 | 3/1980 | Kano et al. | 357/24 LR |
| 4,463,367 | 7/1984 | Collet | 357/24 LR |

OTHER PUBLICATIONS

Abe et al, "A CCD Imager with SiO$_2$ Exposed Photosensor Array", IEEE Int. Electron Devices Meeting (12/77), pp. 542–545.

Primary Examiner—Gene M. Munson

[57] ABSTRACT

In a charge coupled image sensor device, problems with respect to interlacing and a high definition of image points are obviated by defining substantially identical integration regions for the even-numbered and the odd-numbered lines in the image sensor part. Such a CCD sensor device may be controlled by a two-phase clock or by a four-phase clock.

10 Claims, 3 Drawing Sheets

CCD IMAGE SENSOR WITH SUBSTANTIALLY IDENTICAL INTEGRATION REGIONS

This is a continuation of application Ser. No. 573,441, filed Jan. 24, 1984, now abandoned.

BACKGROUND OF THE INVENTION

The invention relates to an image sensor device for receiving a radiation image and converting it into an electrical signal. The device comprises at least one semiconductor body. A plurality of mutually separated, substantially parallel charge transfer channels are provided in the semiconductor body at a major surface thereof. An insulating layer is provided above the channels on the major surface. An electrode system is disposed on the insulating layer above the charge transfer channels for inducing charge transport. Windows are provided in the electrode system so that the radiation image can pass into the semiconductor body and can produce charge carriers therein. The windows are transparent to short wavelength light. The electrode system comprises a first group of electrodes which extend in a direction transverse to the charge transport channels.

Such a device is described in Dutch Patent Application No. 8000999 (corresponding to U.S. Pat. No. 4,463,367). In the radiation-sensitive part of this device, a pattern of charge packets is produced which corresponds to the radiation or exposure pattern. After the end of the integration period, the charge packets can be transferred to a storage register (frame/field transfer). The charge stored in the storage register is then shifted line by line into a shift register, from which it can be read for further processing.

By means of the electrode system, depletion regions can be induced in the underlying semiconductor body. In or near these depletion regions, charge carries can be produced by absorption of radiation. These charge carriers can then be stored in the depletion regions below the electrode system in the form of the aforementioned charge packets.

Dutch Patent Application 8000999 shows an image sensor device in which the windows are bounded transversely to the direction of charge transport by the first group of electrodes. The windows are bounded in the direction of transport by parts of an electrode which mainly extend above the transport channels. In this manner, the image sensor device can shift the charge packets produced in the radiation-sensitive part into the storage register by means of a three phase clock system. In order to obtain a shorter response time and a high speed of transport, the electrode elements parallel to the direction of transport may be interconnected, if desired, by transverse connections. Such an electrode structure provides an image sensor device with a very high sensitivity, especially to blue light.

For further processing, the stored charge which corresponds to a sensed image is generally converted into a signal for a television receiver. To do this, the charge packets in the even numbered lines are read out to form a first field, and the charge packets in the odd numbered lines are read out to form a second field. It is therefore desirable for this so-called interlacing that within one frame period (1/30-1/25 second) charge packets are transferred twice from the radiation-sensitive part to the storage register. The charge storage takes place alternately in different parts of the radiation-sensitive part. For this purpose, the charge packets are alternately collected in the image sensor device within one image period at different areas, i.e. alternately below the two electrodes of the first group and below the electrode parts limiting the windows in the direction of transport.

However, problems arise with this method of interlacing. One problem is that, in order to obtain a high radiation sensitivity, the parts located between the windows of the electrodes parallel to the direction of transport have lengths exceeding their widths. The widths of these electrodes will generally be the minimum track width of the conductor tracks used due to minimization of the surface area to be utilized. In order to obtain a high radiation sensitivity, the lengths of these parts is chosen a few times larger (in a typical embodiment, for example 14 $\mu$m with a minimum track width of 3.6 $\mu$m). When charge is collected under these electrodes, the associated depletion regions therefore have surface areas of approximately 50 $\mu m^2$. At the same time, the integration regions are accurately defined due to the fact that the relative distances between the electrodes is not excessively large (approximately 5 $\mu$m) so that electrons produced between the transfer channels are distributed over these adjacent transport channels.

In the device described in Dutch Patent Application No. 8000999, the channel stopper regions extend under the electrodes of the first group and directly limit the transfer channel. During a second integration period, charge is collected within the same image period under the electrodes which are located at right angles to the charge transport channel and overlap each other in part. With the same (minimum) track width, in this case the depletion region would occupy at most a surface area of approximately 12 $\mu m^2$. Moreover, the depletion region thus produced adjoins the surrounding radiation-transparent windows only at the corners. This means that the charge carriers, especially when they are produced at the center of such a window, must travel across an additionally long path to the depletion region as compared with the situation during the aforementioned first integration period. This effect is increased further by the fact that, in the direction of transport the windows are longer than in the transverse direction.

In order to avoid this effect, the signals produced could be amplified differently, but this requires the use of additional control electronics.

The enlargement of the depletion region under the first electrodes by choosing narrower channel stopper regions under these electrodes, is also only partly effective. In fact, it has been found that especially due to the large distance from the electrode parallel to the direction of transport, the effective sensitivity of adjacent integration regions can be considerably affected by process variations and deviations in the geometry of the electrodes. This is because such variations cause the barriers under these electrodes to be poorly defined. This could possibly be improved slightly by electronically averaging the two image signals in signal processing.

SUMMARY OF THE INVENTION

It is an object of the invention to provide a charge coupled image sensor device which is less sensitive to process variations and mask deviations.

It is another object of the invention to provide such a device in which the charge packets in even and odd numbered image lines are collected in substantially the same manner.

The invention is based on the recognition that while this can be achieved by using an electrode structure in which one continuous electrode structure is formed in the radiation-sensitive part of the device above the transfer channels so that no loss of transport efficiency occurs, this can also be achieved by second and third groups of electrodes. The second and third groups of electrodes define completely or in part the edges of the windows and are arranged transverse to the direction of transport.

In a charge coupled image sensor device according to the invention, therefore, the radiation-transparent windows, viewed at right angles to the surface, are bounded at least in part by a second group of electrodes electrically insulated from the first group of electrodes. The second group of electrodes is part of a second layer of conductive material. The windows are further bounded by a third group of electrodes electrically insulated from the first and second groups of electrodes. The third group of electrodes is part of a third layer of conductive material. The second and third groups of electrodes extend mainly transverse to the charge transport channels. The electrodes of the third group partly overlap the electrodes of the second group at least at the area of the charge transfer channels.

As a result, the windows will be defined with a greater consistency. In fact, they are now bounded in the direction of transport by electrodes of the first group of electrodes provided in one processing step. In the transverse direction, the windows are bounded by parts of the electrodes of the second or third groups of electrodes, where the electrodes of the second and third groups can take the same form. Possible relative displacements of the second and third groups of electrodes are now substantially equal throughout the semiconductor device and do not influence the size of the windows.

The parts of the electrode above the transfer channels, such as described for the image sensor device in Dutch Patent Application No. 8000999, are now effectively subdivided into two groups. Charge can be collected alternately under electrode parts of one of the two groups. These electrode parts are located directly beside the radiation-transparent windows. By means of a four phase clock system, for the sake of interlacing, charge can then be collected twice within one image period practically in an identical way from substantially adjacent accurately defined parts of the radiation-sensitive part of the device.

At the expense of a certain amount of space, the relative variations in the sizes of the windows in different semiconductor bodies can be reduced even further by bounding the windows entirely by the second and third groups of the electrodes. Consequently, possible variations in sensitivity to blue light due to alignment tolerances during the manufacture of the first group of electrodes are avoided.

In a preferred embodiment of an image sensor device according to the invention, the electrodes of the first group are alternately coupled to an electrode of the second and third groups in such a manner that the coupling, at least in operation, introduces a potential difference between the electrodes of the first group and the electrodes of the second and third groups, respectively.

Such a device is particularly suitable for charge transport by means of a two phase clock system.

Figure 1:
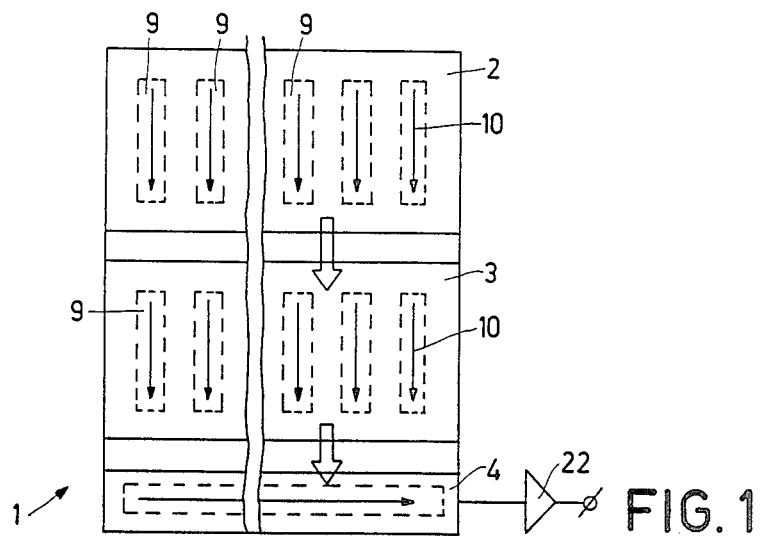
FIG. 1 schematically shows a charge coupled image sensor device.
Figure 2:
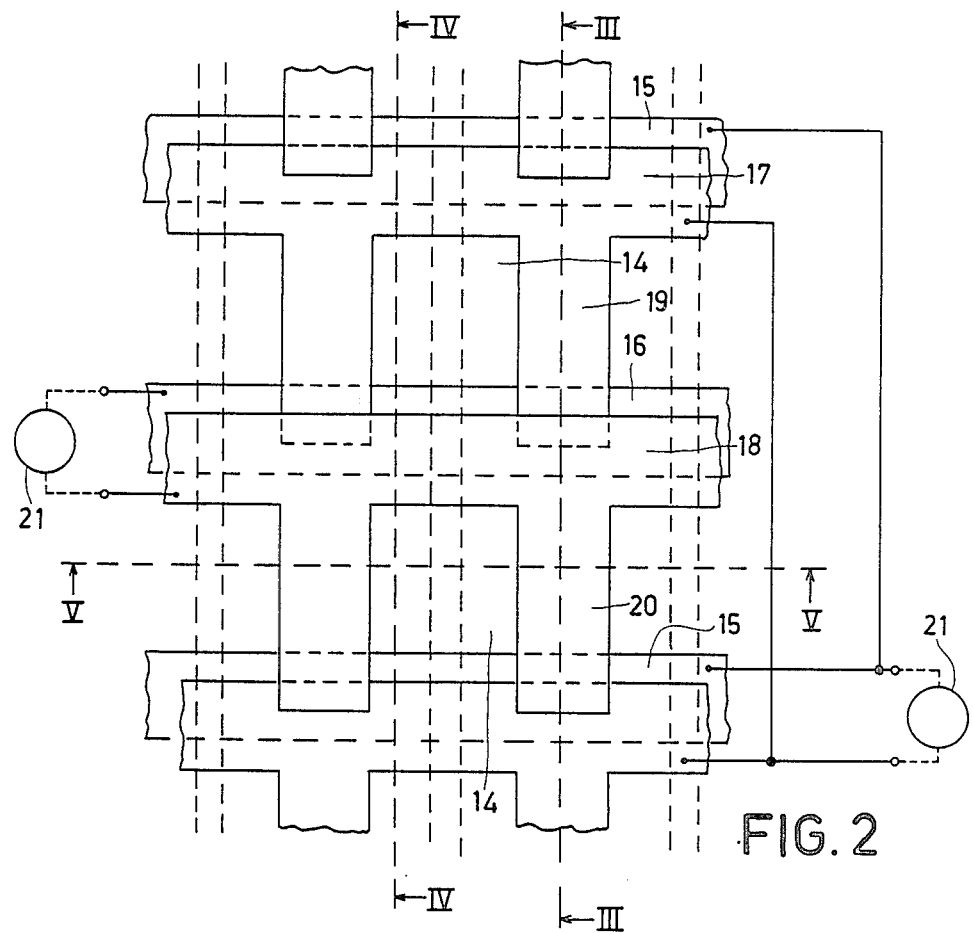
FIG. 2 is a partly schematic, partly plan view of a part of the radiation-sensitive part of such an image sensor device.
Figure 3:
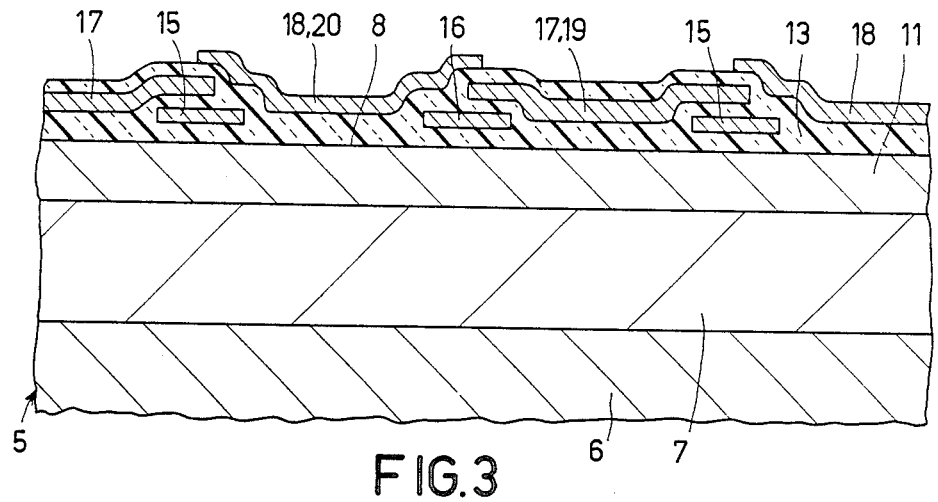
FIG. 3 is a cross-sectional view on the line III—III of the image sensor device of FIG. 2.

The Figures are schematic and are not drawn to scale. For the sake of clarity, the thickness dimensions are strongly exaggerated. Semiconductor zones of the same conductivity type are generally cross-hatched in the same direction. In the various embodiments, corresponding parts are generally designated by like reference numerals.

DESCRIPTION OF THE PREFERRED EMBODIMENTS

FIG. 1 shows a charge coupled image sensor device 1 of the so-called frame/field-transfer type. Such an image sensor device comprises a radiation-sensitive sensor part 2. A pattern of electric charge carriers corresponding to the radiation image is formed in part 2 during a given exposure period. After the exposure period, the pattern of electric charge carriers is stored temporarily in the storage part 3. The pattern is sequentially read from storage part 3 by the shift register 4. This charge pattern can be read by techniques known per se. If desired, the signals obtained may be amplified before further processing by the amplifier 22.

The image sensor device (FIGS. 2-5) comprises a semiconductor body 5. Body 5 is composed, for example, an n-type silicon substrate 6 having a resistivity of approximately 10 $\Omega$.cm (approximately $5.10^{14}$ donor atoms/cm$^3$). A p-type region 7 is deposited on substrate 6. Region 7 has a dopant concentration of approximately $3.10^{15}$ acceptor atoms/cm$^3$. The p-type region 7 may be deposited, for example, by epitaxial growth.

At the major surface 8 of the semiconductor body 5, there are defined a plurality of mutually separated, substantially parallel charge transfer channels (in FIG. 1 designated by reference numeral 9). Charge transport in these channels is indicated schematically in FIG. 1 by arrows 10.

Figure 4:
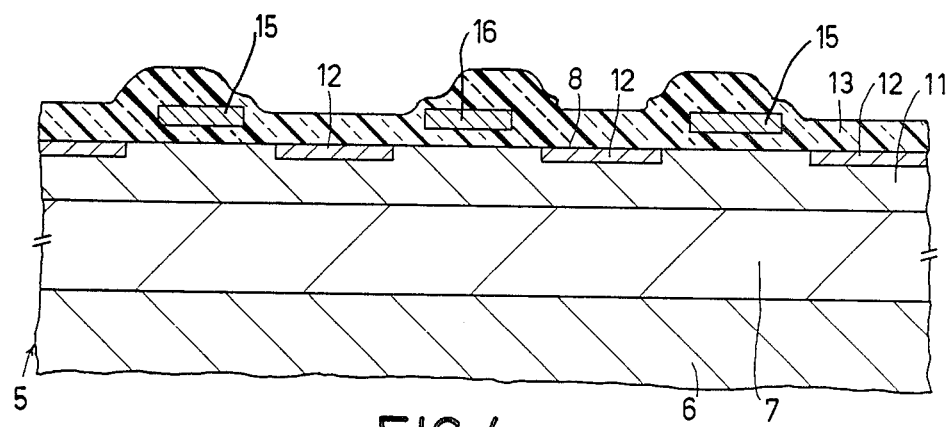
FIG. 4 is a cross-sectional view on the line IV—IV of the image sensor device of FIG. 2.
Figure 5:
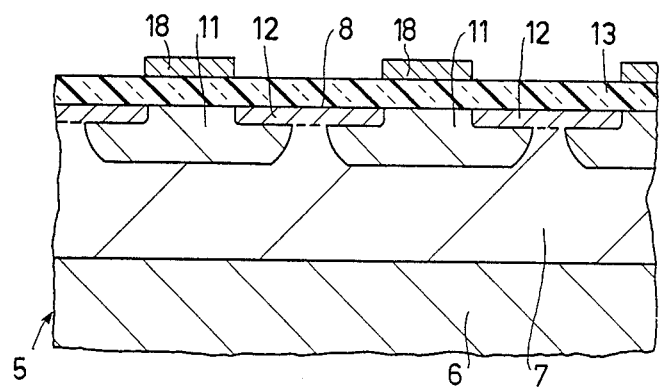
FIG. 5 is a cross-sectional view on the line V—V of the image sensor device of FIG. 2.

In the present case, the charge transfer device or ccd uses bulk transport, and is therefore known as a pccd or bccd. The charge transfer channels are n-type regions 11 which are mutually separated by p-type regions 12 (FIG. 4). The n-type regions in this example each have an average impurity concentration of approximately $10^{16}$ atoms/cm$^3$, a depth of approximately 1 $\mu$m, a width of approximately 3.5 $\mu$m. The p-type regions 12 each have a surface concentration of approximately $10^{18}$ atoms/cm$^3$, a surface width of approximately 5 $\mu$m, and a depth approximately 0.5 $\mu$m into the semiconductor body 5.

The major surface 8 is coated with a layer 13 of insulating material, for example silicon oxide. On this insulating layer 13 is disposed a first set of electrodes for producing potential wells in the semiconductor material for charge storage and charge transport.

The first set of electrodes 15 and 16 are mutually insulated and extend in a direction perpendicular to the direction of the charge transport channels. Electrodes 15 and 16 extend in equal intervals of approximately 4 $\mu$m along the channel.

The electrodes are made of, for example, polycrystalline silicon. Since polycrystalline silicon is comparatively poorly transparent to short wavelength (blue) light, the electrode system is provided with windows 14. Through windows 14, light (especially blue light) can penetrate into the semiconductor body 5 and can produce charge carriers therein.

According to the invention, the electrode system therefore comprises a second set of electrodes 17 and a third set of electrodes 18. Electrodes 17 and 18 are located mainly transverse to the transfer channels 11. However, projecting parts 19 and 20 of electrodes 17 and 19 extend above these channels 11 in a direction parallel to the charge transport direction.

The electrodes 17 and 18 and the electrodes 15 and 16 bound the radiation-transparent windows 14 in directions transverse to the channels 11. The projecting parts 19 and 20 of the electrodes 17 and 18 bound the windows 14 in the directions of the channels 11. Above the channel 11, the electrode 18 overlaps, in part, projecting parts 19 of electrode 17. The projecting parts 20 of the electrode 18 overlap, in part, a next electrode 17 located on the other side of the electrode 18. Due to the fact that the charge transfer channels 11 are thus covered entirely by the electrode system, no loss of transport efficiency occurs when charge is transported under these electrodes. Above the channels 11, the electrodes 15, 16, 17 and 18 constitute an electrode system for a four phase clock system.

In this configuration, charge carriers produced by radiation can now be alternately integrated in a similar manner in adjacent regions. For this purpose, the charge packets are alternately collected under the projecting parts 19 and 20 of the electrodes 17 and 18, respectively. Upon exposure of the radiation-sensitive part 2 of the image sensor device, charge carriers are produced. Blue light produces charge carriers substantially only down to a depth of approximately 0.1 $\mu$m, in particular in the p-type region 12, which is left exposed by the windows 14. The holes produced due to this radiation remain in the p-type region 12. The electrons produced migrate over to the adjacent charge transfer channels 11 due to the application of a voltage to the electrode 17 or to the electrode 18 such that potential wells for electrons are obtained in the charge transfer channels under the electrodes 17 and 18.

Light of greater wavelengths reaches the surface 8 also outside the windows 14 and produces charge carriers down to a much larger depth. The electrons then flow to the nearest potential wells in the channel regions 11, while the holes are drained through the p-type regions 12 or the p-type substrate 7.

Within one image period, for example, during the first half of the period a voltage is first applied to the electrodes 17 such that potential wells are formed under the projecting parts 19 in the channel regions 11. Charge packets (electrons) are collected in the potential wells in the manner described above. The projecting parts 15 then each have, for example, a length of 5 $\mu$m, and a width of 3.6 $\mu$m, and a separation of 5 $\mu$m.

Subsequently, the charge packets are transported to the storage part 3, by applying suitably chosen clock voltages to the electrodes 15, 16, 17, and 19, for further processing.

During the second half of the period, potential wells are first formed under the projecting parts 20 of the electrodes 18. Parts 20 have the same dimensions as the parts 19. Thus, in both halves of one period charge is collected in substantially the same manner in two rows of image elements. After the charge packets have been collected, they are transported to the storage part 3. The clock signals required for the electrodes 15, 16, 17 and 18 may be used, if desired, to transfer the information still stored from the first half of the image sensing period to an output register 4 for further processing.

In an even more favorable method of interlacing, charge is continuously collected under the electrode parts 19 and 20 of the electrodes 17 and 18. After the integration periods, during the first half of an image period for example, the charge packets collected under the electrode parts 19 are added to those collected under the electrode parts 20. During the second half, the charge packets collected under the electrode parts 20 are added to those collected under the parts 19. The adding process is effected so that the charge transport takes place in the direction of the arrows 10.

The storage part 3 need not collect radiation and consequently need not be provided with windows. Therefore, as a whole it can be provided on a considerably smaller surface area than the radiation-sensitive part 2.

The required charge transport clock signals, both in the sensor part 2 and in the storage part 3, can be obtained, like the clock signals for the shift register 4, in a well manner. For example, the clock signals can be obtained by shift registers (not shown in FIG. 1).

The device can be manufactured in a usual manner. After a p-type epitaxial layer 7 has been grown onto the n-type substrate 6, n-type channels 11 are formed in this layer 7 by implantation or diffusion. A thin oxide layer 13 is deposited on the surface 8. The electrodes 15 and 16 are formed in a well known manner, preferably from polycrystalline silicon on oxide layer 13. After an oxidation step for electrically insulating the electrodes 15 and 16, the electrodes 17 and 19 are formed from polycrystalline silicon. After these electrodes have been electrically insulated by another oxidation step, the electrodes 18 and 20 are formed. After the electrode system has been finished in this manner, the regions 12 are formed by an implantation step.

The device shown in FIGS. 1 to 5 can be used in a simple manner with a two phase clock system. This can be done by applying a potential difference between the electrodes 16 and 18, and the electrodes 15 and 17 so that asymmetrical potential wells are obtained. The potential difference, which is indicated schematically in FIG. 2 by the voltage sources 21, may be applied, for example, by a voltage divider. This is described in Dutch Patent Application No. 7,200,519 (corresponding to U.S. Pat. Nos. 3,758,794 and 3,760,202). The potential difference may alternatively be applied by a capacitive coupling, as described in Dutch Patent Application No. 7,114,859 (corresponding to U.S. Pat. No. 3,921,195). An additional advantage of this configuration is the low relative capacitance between the two clock phases because these phases overlap each other over a very small part.

Figure 6:
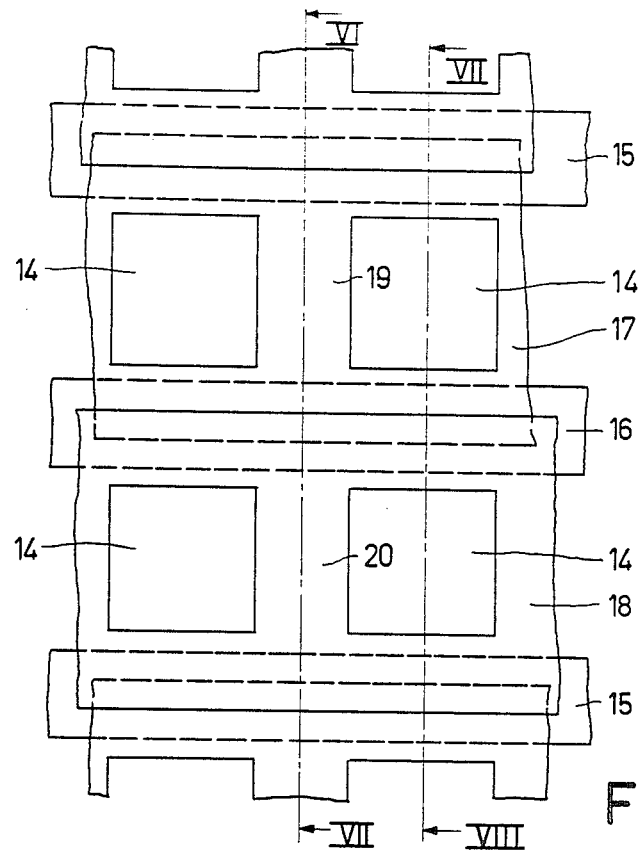
FIG. 6 is a plan view of a part of the radiation-sensitive part of another image sensor device according to the invention.
Figure 7:
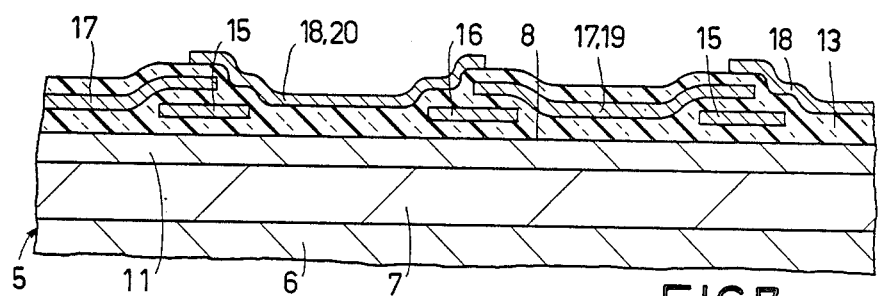
FIG. 7 is a cross-sectional view on the line VII—VII of the image sensor device of FIG. 6.
Figure 8:
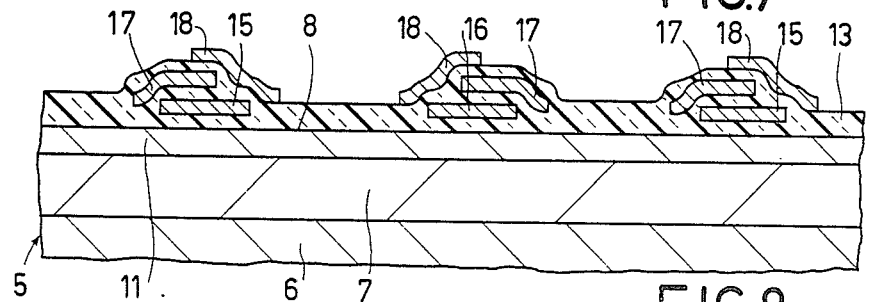
FIG. 8 is a cross-sectional view on the line VIII—VIII of the image sensor device of FIG. 6.

In the device shown in FIGS. 6 to 8, the electrodes 17 and 18 are constructed so that they fully define the windows 14. Although this is achieved at the expense of reducing the surface area, all the windows 14 are now fully identical. This can be manufactured by using the same mask in the manufacture of the relatively shifted electrodes 17 and 18. Due to the fact that the electrodes 15 and 16 now do not bound the the windows 14, tolerances between these electrodes and the electrodes 17 and 18 no longer influence the size of the windows.

The charge packets are now alternately collected mainly under the connecting parts 19 and 20 or in the other interlacing method are collected simultaneously under the parts 19 and 20. Otherwise, the reference numerals have the same meanings as in the preceding embodiment.

Of course, the invention is not limited to the embodiments described above. Various modifications are possible for those skilled in the art without departing from the scope of the invention. For example, in a manner analogous to FIGS. 6 to 8, electrodes 17 and 18 may be constructed as long strips with openings without fully defining the windows, for example when the distance between the electrodes 15 and 16 is smaller than the dimensions of the openings in the transport device. Besides, other kinds of transport devices may be used, such as, for example, bucket brigade registers and surface ccd's.

What is claimed is:

1. A charge coupled image sensor device for receiving a radiation image and converting it into an electrical signal, said device consisting essentially of;
   a semiconductor body having a major surface, said semiconductor body having a plurality of charge transfer channels therein adjoining the major surface, said charge transfer channels being substantially parallel to and separated from each other by separation regions in the semiconductor body;
   an insulating layer on the major surface of the semiconductor body; and
   a system of electrodes on the insulating layer;
   characterized in that the electrode system consists essentially of:
   a first group of electrodes extending transverse to the charge transfer channels, said electrodes being pervious to light of a first wavelength range, said electrodes being separated from each other to define gaps therebetween;
   a second group of electrodes, each electrode of the second group extending between pairs of electrodes of the first group over alternate gaps between the electrodes of the first group, said electrodes of the second group being electrically insulated from electrodes of the first group, each electrode of the second group having a base portion extending transverse to the charge transfer channels, each electrode of the second group having projecting portions extending over each charge transfer channel, said projecting portions being separated from each other to form gaps therebetween, said electrodes being pervious to light of a first wavelength range;
   a third group of electrodes, each electrode of the third group extending between pairs of electrodes of the first group over alternate gaps between the electrodes of the first group which are not bridged by electrodes of the second group, said electrodes of the third group being electrically insulated from electrodes of the first and second groups, each electrode of the third group having a base portion extending transverse to the charge transfer channels, each electrode of the third group having projecting portions extending over each charge transfer channel, said projecting portions being separated from each other to form gaps therebetween, said third electrodes being pervious to light of a first wavelength range;
   wherein the gaps between the electrodes of the first group overlap the gaps between the projecting portions of the electrodes of the second and third groups to form windows which are pervious to light of a second wavelength range which is larger than the first wavelength range, said windows being arranged above separation regions only.

2. A device as claimed in claim 1, characterized in that each electrode of the second and third groups is comb-shaped, the teeth of the comb extending over the charge transfer channels.

3. A device as claimed in claim 1, characterized in that the electrode system can be used for four phase charge transport.

4. A device as claimed in claim 1, characterized in that each electrode of the first group is coupled to one adjoining electrode of the second or third groups by way of a voltage source.

5. A device as claimed in claim 1, characterized in that the windows are openings in the electrodes of the second and third groups.

6. A device as claimed in claim 5, characterized in that the electrodes of the second and third groups are substantially identical to each other.

7. A device as claimed in claim 6, characterized in that the electrode system can be used for two phase charge transport.

8. A device as claimed in claim 6, characterized in that the device further comprises a control circuit and a signal processing circuit.

9. A device as claimed in claim 8, characterized in that the control circuit and the signal processing circuit are formed in the semiconductor body.

10. A charge coupled image sensor device of the frame transfer type comprising a semiconductor body in which at a major surface a plurality of mutually separated substantially parallel charge transfer channels are defined, forming an image section for collecting a radiation image and converting it into electrical signals, and a storage section in which said electrical signals after one integration period may be transferred and stored in behalf of read-out, wherein the image section comprises an electrode system comprising:
   a first group of electrodes which extend in a direction transverse to the plurality of charge transfer channels, and are located at a distance from each other, thus defining a gap therebetween;
   a second group of electrodes, filling alternately gaps between the electrodes of the first group, each electrode of the second group having a base portion extending in a direction transverse to the plurality of charge transfer channels, and projecting portions extending from the base portion above and parallel to the charge transfer channels, each projecting portion extending substantially above the whole width of the associated charge transfer channel, said base portion together with said projecting portions extending over the whole gap between adjacent electrodes of the first group, overlapping these electrodes, and being insulated therefrom by an intermediate insulating layer;

a third group of electrodes filling the remaining gaps between the electrodes of the first group, each electrode of the third group having a base portion extending in a direction transverse to the plurality of charge transfer channels, and projecting portions extending from the base portion above and parallel to the charge transfer channels, each projecting portion extending substantially above the whole width of the associated charge transfer channel, said base portion together with said projecting portions extending over the whole gap between adjacent electrodes of the first group, overlapping these electrodes and being insulated therefrom by an intermediate insulating layer, the electrodes of the third group being electrically insulated also from the electrodes of the second group;

wherein said gaps between the electrodes of the first group, the base portions and the projecting portions of the electrodes of the second and third groups have such dimensions that in the electrode system windows are formed at the area of which the surface of the semiconductor body is left free from material forming the electrode system, whereby radiation and more paticularly shortwave light can easily penetrate through the windows into the semiconductor body to produce therein charge carriers.

* * * * *